(12) United States Patent
Lee

(10) Patent No.: US 7,616,034 B2
(45) Date of Patent: Nov. 10, 2009

(54) CIRCUIT FOR CONTROLLING DATA OUTPUT

(75) Inventor: Hyeng Ouk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 135 days.

(21) Appl. No.: 11/770,880

(22) Filed: Jun. 29, 2007

(65) Prior Publication Data

US 2008/0008283 A1   Jan. 10, 2008

(30) Foreign Application Priority Data

Jun. 29, 2006   (KR) .................... 10-2006-0059802

(51) Int. Cl.
*H03L 7/00* (2006.01)
*G01R 29/02* (2006.01)

(52) U.S. Cl. .................. 327/144; 327/141; 327/142; 327/2; 327/47

(58) Field of Classification Search ............... 327/2–12, 327/31, 141, 153, 161, 163, 231–260, 261, 327/263, 276, 277, 284, 39–49
See application file for complete search history.

(56) References Cited

U.S. PATENT DOCUMENTS 6,404,248 B1 *   6/2002   Yoneda ..................... 327/158

| | | | |
|---|---|---|---|
| 7,405,996 B2 * | 7/2008 | Minzoni et al. | 365/233.1 |
| 2005/0174155 A1 * | 8/2005 | Heightley et al. | 327/158 |
| 2007/0152715 A1 * | 7/2007 | Park | 327/3 |

FOREIGN PATENT DOCUMENTS

| KR | 1020040021478 | 3/2004 |
|---|---|---|
| KR | 1020050105557 | 11/2005 |
| KR | 1020060056550 | 5/2006 |

OTHER PUBLICATIONS

Notice of Patent Grant mailed Jan. 8, 2008 for the corresponding KR10-2006-0059802.

* cited by examiner

*Primary Examiner*—Lincoln Donovan
*Assistant Examiner*—Colleen O'Toole
(74) *Attorney, Agent, or Firm*—Ladas & Parry LLP

(57) ABSTRACT

Disclosed is a data output control circuit for controlling data output. The data output control circuit includes a delay lock loop for outputting a first clock by delaying an external clock in response to a control signal, a phase detector for outputting a detection signal by detecting a frequency of the external clock in response to the control signal, a decoder for outputting a selection signal by decoding the detection signal, and a delay unit for outputting a second clock by delaying the first clock or inverting and delaying a phase of the first clock in response to the selection signal.

17 Claims, 10 Drawing Sheets

CIRCUIT FOR CONTROLLING DATA OUTPUT

BACKGROUND OF THE INVENTION

1. Field of the Invention

The present invention relates to a semiconductor memory device, and more particularly to a data output control circuit for controlling data output.

2. Description of the Prior Art

Generally, a Dynamic Random Access Memory (DRAM) is a volatile memory device including a plurality of cells, wherein each of the cells includes one transistor and one capacitor.

A synchronous DRAM has a multibank and a pipelined data path structure, is determined an operation state by commands according to control signals such as /CAS, /RAS and /WE, and operates in synchronization with a system clock.

Such a synchronous DRAM has a Read Access Time tAA which a data transfers from a memory cell to a data output control block in response to a read operation, and a DRAM outputs data in synchronization with an external clock by using a CAS Latency (hereinafter, referred to as CL).

In the meantime, a DRAM generates an Output Enable signal (hereinafter, referred to as OUTEN) in order to output data in synchronization with clocks according to each CL after a read command. An output enable signal generator latches a read command signal, which is inputted in synchronization with an external clock, by a Delay Lock Loop (hereinafter, referred to as DLL) clock (hereinafter, referred to as DLLCLK), thereby generating an OUTEN.

Referring to FIG. 1, a read command signal READ is delayed by a read command delay time tCMD through an internal read command generator 10, and is outputted as an internal read command (hereinafter, referred to as RDCMD). In a DLL-on operation, a DLL 20 negatively delays a clock (hereinafter, referred to as CLK) to generate a DLLCLK. A delay unit 30 generates an inverted DLL clock (hereinafter, referred to as FDLLCLK) obtained by inverting and delaying the phase of the DLLCLK, and outputs the FDLLCLK to an output enable signal generator 40. Accordingly, the output enable signal generator 40 can always perform a domain crossing operation while keeping a half margin of a clock cycle time tCK.

In a DLL-off operation, the DLL 20 positively delays a CLK to generate a DLLCLK. The delay unit 30 generates a FDLLCLK obtained by inverting and delaying the phase of the DLLCLK, and outputs the FDLLCLK to the output enable signal generator 40. However, the output enable signal generator 40 may cause a domain crossing error because it does not ensure a proper domain crossing margin.

A case in which a domain crossing error may occur will be described in more detail with reference to a timing diagram illustrating the domain crossing operation of the output enable signal generator 40.

First, the operation of a data output control circuit in a DLL-on state will be described with reference to FIGS. 2 and 3.

In the DLL-on state, a domain crossing operation can be normally performed even when a high frequency clock is inputted, similarly to a case where a low frequency clock is inputted. That is, the output enable signal generator 40 can latch a RDCMD at the rising edge of a FDLLCLK while keeping a half margin of a clock cycle time tCK.

The normal domain crossing operation is possible because the delay unit 30 compensates for the delay tCMD of the RDCMD and the negative delay of the DLL 20, generates a FDLLCLK obtained by inverting and delaying the phase of a DLLCLK, and ensures a margin.

Next, the operation of the data output control circuit in a DLL-off state will be described with reference to FIGS. 4 and 5.

In the DLL-off state, the domain crossing operation may cause an error when a high frequency clock is inputted, differently from a case where a low frequency clock is inputted. That is, the output enable signal generator 40 may cause a domain crossing error because it does not ensure a proper domain crossing margin when a high frequency clock is inputted, differently from a case where a low frequency clock is inputted.

When a low frequency clock is inputted, it is possible to ensure the enough margin of a pulse width, in which domain crossing can be performed, even when only a positive delay is applied because the DLL 20 is turned off. Accordingly, a domain crossing error does not occur. However, when a high frequency clock is inputted, only a positive delay is applied to a CLK in a case where the DLL 20 has been turned off. Therefore, the delay tCMD of the RDCMD is not compensated for, which results in the occurrence of a cross point at which the rising edges of the RDCMD and the FDLLCLK coincide with each other.

Herein, the cross point denotes the time point at which there is no timing margin between the time point at which the RDCMD is enabled and the rising edge of the FDLLCLK. If the cross point occurs, an error occurs in the process of latching the RDCMD to the FDLLCLK, and the enable timing of an OUTEN becomes improper. As a result, data failure occurs.

SUMMARY OF THE INVENTION

Accordingly, the present invention has been made to solve the above-mentioned problems occurring in the prior art, and an object of the present invention is to select a DLL clock used for domain crossing by detecting a clock frequency in a DLL-off operation.

In order to achieve the above object, according to one aspect of the present invention, there is provided a data output control circuit including: a delay lock loop for outputting an external clock by delaying as a first clock (DLLCLK) in response to a control signal (DLLOFF); a phase detector for outputting a detection signal by detecting a frequency of the external clock in response to the control signal; a decoder for outputting a selection signal by decoding the detection signal; and a delay unit for outputting as a second clock (DLLCLKD) by delaying the first clock or inverting and delaying a phase of the first clock in response to the selection signal.

It is preferred that the delay lock loop positively delays the external clock if the control signal is enabled, thereby outputting the first clock. Further, the delay lock loop negatively delays the external clock if the control signal is disabled, thereby outputting the first clock.

It is preferred that the control signal is a signal for controlling on/off of the delay lock loop, which is generated by a mode register set command and is determined by an address bit inputted together with the mode resister set command.

It is preferred that the phase detector outputs determination results for level states of an edge delay signal as the detection signal, the edge delay signal being obtained by delaying an edge of the external clock, the level states being determined during a predetermined cycle of the external clock. Further, the phase detector operates when the control signal is enabled.

The phase detector includes: an edge signal generator for generating a first edge signal synchronized with a first rising edge of the external clock, and a second edge signal synchronized with a second rising edge of the external clock; a delay means for generating at least one edge delay signal by delaying the first edge signal; an edge delay signal determiner for generating the detection signal according to level states of the edge delay signal in response to the second edge signal; and a clock transfer means for selectively transferring the external clock to the edge signal generator in response to the control signal.

The edge signal generator includes: a first edge signal generating unit for generating the first edge signal shifted to a predetermined state in synchronization with the first rising edge of the external clock; a transfer gate for selectively transferring the first edge signal in response to an inverted first edge signal having a phase inverse to that of the first edge signal; a first latch for latching and outputting the first edge signal transferred from the transfer gate; a second edge signal generating unit for receiving the first edge signal; from the transfer gate, and generating the second edge signal shifted to a predetermined state in synchronization with the second rising edge of the external clock; and a second latch for latching and outputting the second edge signal.

It is preferred that the delay means includes a plurality of delay units connected in series, and generates a plurality of edge delay signals having amount of delay sequentially increasing through the delay units.

It is preferred that the edge delay signal determiner t outputs the detection signal according to the level states of the edge delay signal if the second edge signal is in a high level state.

It is preferred that the edge delay signal determiner generates a detection signal determining the external clock as a high frequency if many edge delay signals at a low level state exist in the edge delay signals in a state in which the second edge signal is in a high level state.

It is preferred that the edge delay signal determiner generates a detection signal determining the external clock as a low frequency if many edge delay signals at a high level state exist in the edge delay signals in a state in which the second edge signal is in a high level state.

The edge delay signal determiner includes delay signal determination units corresponding the edge delay signals, wherein each of the delay signal determination units includes a is first PMOS transistor, a second PMOS transistor, a first NMOS transistor and a second NMOS transistor, which are connected in series between supply voltage and ground voltage.

It is preferred that the edge delay signal is inputted to gates of the first PMOS transistor and the second NMOS transistor, the second edge signal inverted by an inverter is inputted to a gate of the second PMOS transistor, and the second edge signal is inputted to a gate of the first NMOS transistor.

The decoder includes: a falling output gate for receiving a signal obtained by decoding the detection signal determined as the low frequency clock, thereby outputting a falling selection signal; and a rising output gate for receiving a signal obtained by decoding the detection signal determined as the high frequency clock, thereby outputting a rising selection signal.

The data output control circuit of the present invention further includes: an internal read command generator for outputting an internal read command by delaying a read command; and an output enable signal generator for generating an output enable signal by latching the internal read command to a rising edge of the second clock.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
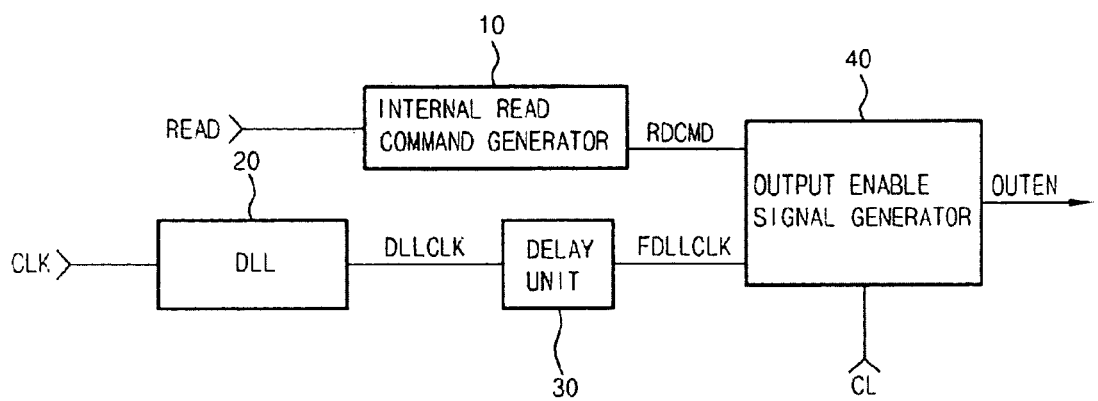
FIG. 1 is a block diagram illustrating the construction of a conventional data output control circuit.
Figure 2:
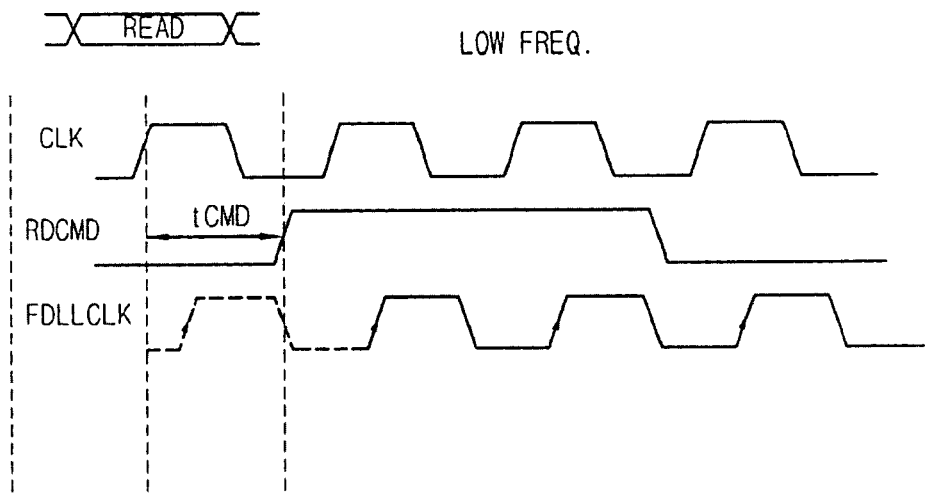
FIG. 2 is a timing diagram illustrating a domain crossing operation when a low frequency clock is inputted and a DLL is turned on in the data output control circuit in FIG. 1.
Figure 3:
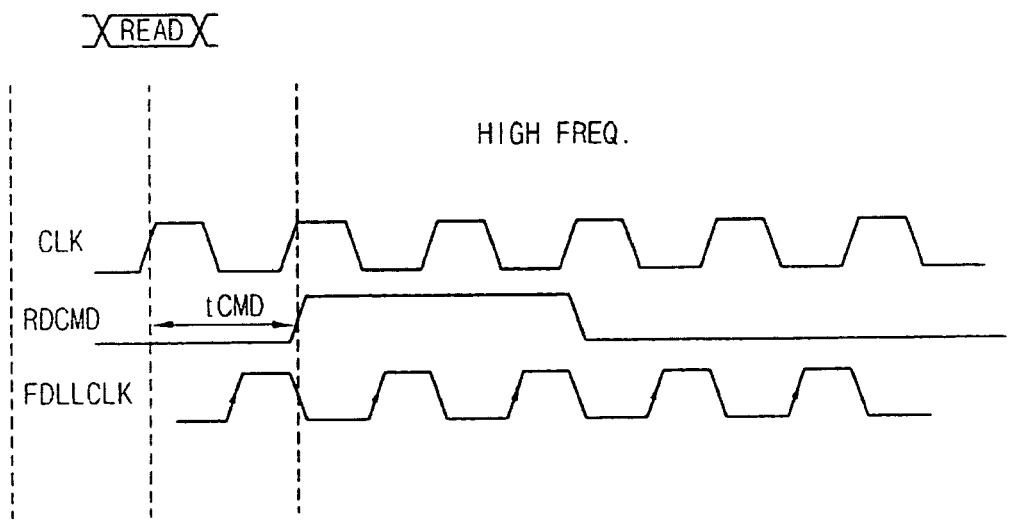
FIG. 3 is a timing diagram illustrating a domain crossing operation when a high frequency clock is inputted and a DLL is turned on in the data output control circuit in FIG. 1.
Figure 4:
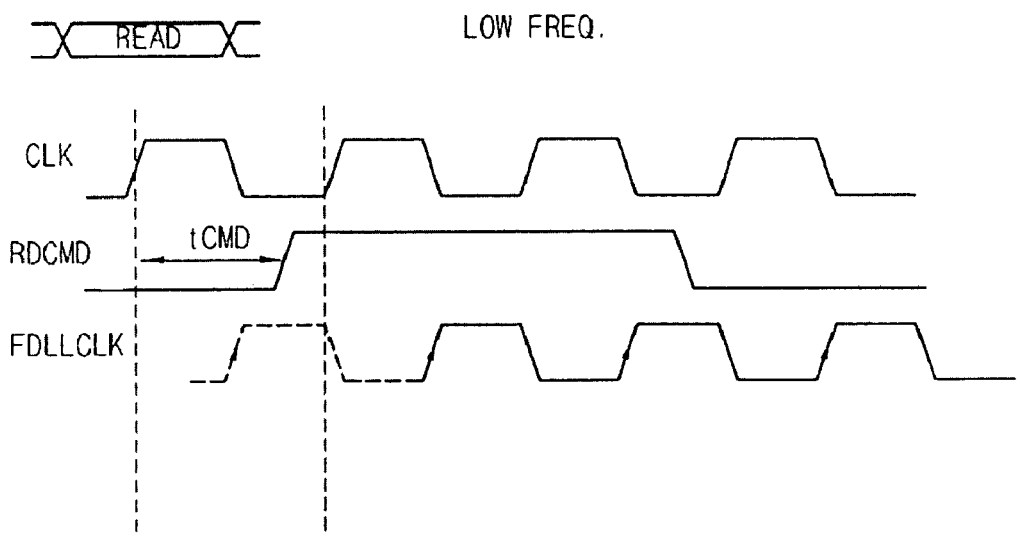
FIG. 4 is a timing diagram illustrating a domain crossing operation when a low frequency clock is inputted and a DLL is turned off in the data output control circuit in FIG. 1.
Figure 5:
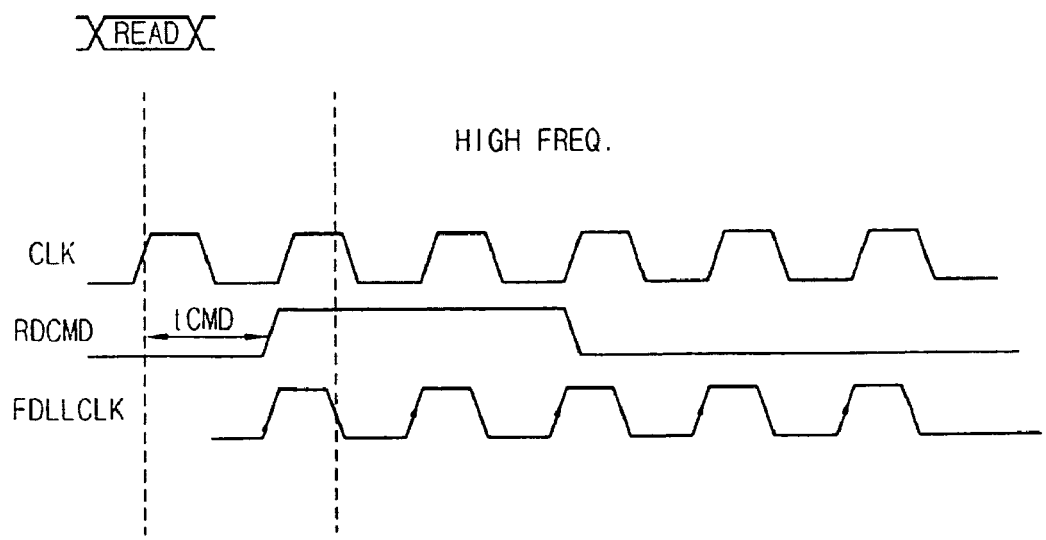
FIG. 5 is a timing diagram illustrating a domain crossing operation when a high frequency clock is inputted and a DLL is turned off in the data output control circuit in FIG. 1.
Figure 6:
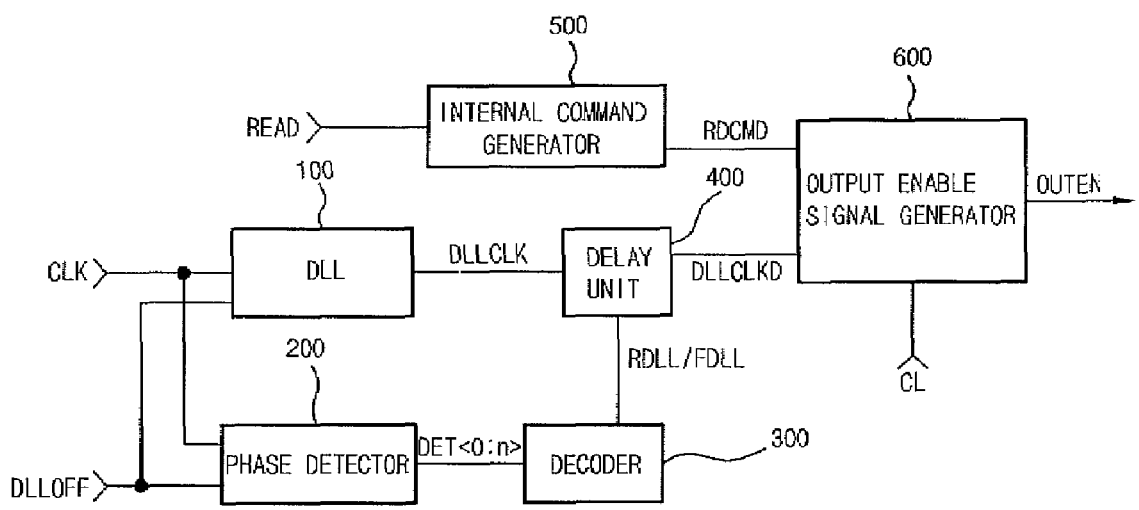
FIG. 6 is a block diagram illustrating the construction of a data output control circuit according to one embodiment of the present invention.

FIG. 6 is a block diagram illustrating the construction of a data output control circuit according to one embodiment of the present invention. The data output control circuit includes a DLL 100, a phase detector 200, a decoder 300, a delay unit 400, an internal command generator 500, and an output enable signal generator 600.

The DLL 100 generates a DLLCLK for allowing data to be synchronized with an external clock CLK. In a DLL-on state, The DLL 100 outputs a DLLCLK obtained by negatively delaying the external clock CLK. In a DLL-off state, the DLL 100 outputs a DLLCLK obtained by positively delaying the external clock CLK.

Herein, the negative delay denotes a delay applied before data is outputted through an internal circuit. The positive delay denotes a delay naturally generated through the internal circuit.

The DLL 100 may be turned on/off by a DLL off signal (hereinafter, referred to as DLLOFF) generated by an EMRS (Extended Mode Resist Set) command. It is preferred that the state of a DLLOFF is determined by the state of an address bit inputted together with an EMRS command.

The phase detector 200 determines the level state of an edge delay signal obtained by delaying the edge of the external clock during one cycle of the external clock CLK, and outputs a detection signal DET<0:n> used for detecting whether the external clock CLK is a high frequency clock. It is preferred that the phase detector 200 operates when the DLLOFF is enabled, i.e. when the DLL 100 is in the DLL-off state.

Herein, the high frequency clock denotes a clock with a frequency higher than a frequency in a domain crossing operation, i.e. when an error occurs due to non-ensurance of a domain crossing margin when latching a read command RDCMD by an external clock CLK, to which a positive delay has been applied, in the DLL off state.

The decoder 300 decodes the detection signal DET<0:n>, and enables and outputs a rising selection signal (hereinafter, referred to as RDLL) or a falling selection signal (hereinafter, referred to as FDLL). Herein, n denotes a natural number. In the present embodiment, n has a value of 2.

The delay unit 400 delays and outputs a DLLCLK in response to the RDLL or the FDLL, or inverts and delays the phase of the DLLCLK for output. In more detail, the delay unit 400 delays the DLLCLK, to which a positive delay has been applied, if the RDLL is enabled when the DLL 100 is in the DLL off state, and outputs an inverted DLL clock (hereinafter, referred to as DLLCLKD). If the FDLL is enabled, the delay unit 400 inverts and delays the phase of the DLLCLK to which the positive delay has been applied, and outputs the DLLCLKD. Since the delay unit 400 can be constructed by those skilled in the art by using a transfer gate, an inverter, a delay means, etc., with reference to the description about the delay unit 400, details will be omitted.

The internal command generator 500 delays an inputted read command READ by tCMD, thereby outputting a RDCMD.

The output enable signal generator 600 latches the enabled RDCMD to the rising edge of the DLLCLKD, thereby generating an signal OUTEN. The signal OUTEN may be used as a signal for allowing data to be synchronized with an external clock and be outputted. Further, a CL may be applied to the output enable signal generator 600.

Figure 7:
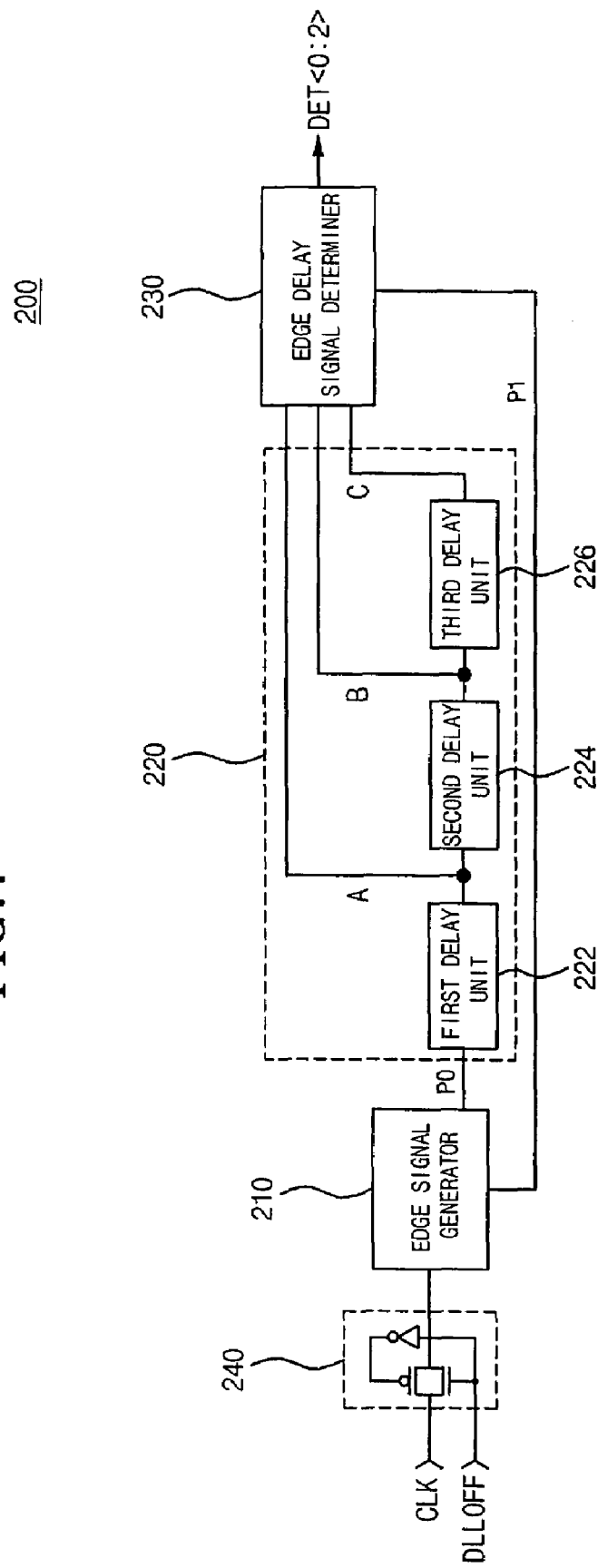
FIG. 7 is a block diagram illustrating the construction of the phase detector in FIG. 6.

FIG. 7 is a block diagram illustrating the construction of the phase detector 200 in FIG. 6. Referring to FIG. 7, the phase detector 200 includes an edge signal generator 210, a delay means 220, an edge delay signal determiner 230, and a clock transfer means 240.

The edge signal generator 210 outputs a first edge signal PO synchronized with the first rising edge of an external clock, and a second edge signal P1 synchronized with the second rising edge of the external clock.

The delay means 220 delays the first edge signal PO through a plurality of delay units connected in series, thereby generating a plurality of edge delay signals A, B, C having the amount of delay sequentially increasing. In the present embodiment, the delay unit includes a first delay unit 222, a second delay unit 224 and a third delay unit 226.

The edge delay signal determiner 230 generates a detection signal DET<0:2> according to the level states of the edge delay signals A to C in response to the second edge signal P1.

The clock transfer means 240 selectively inputs the external clock to the edge signal generator 210 in response to a DLLOFF.

Figure 8:
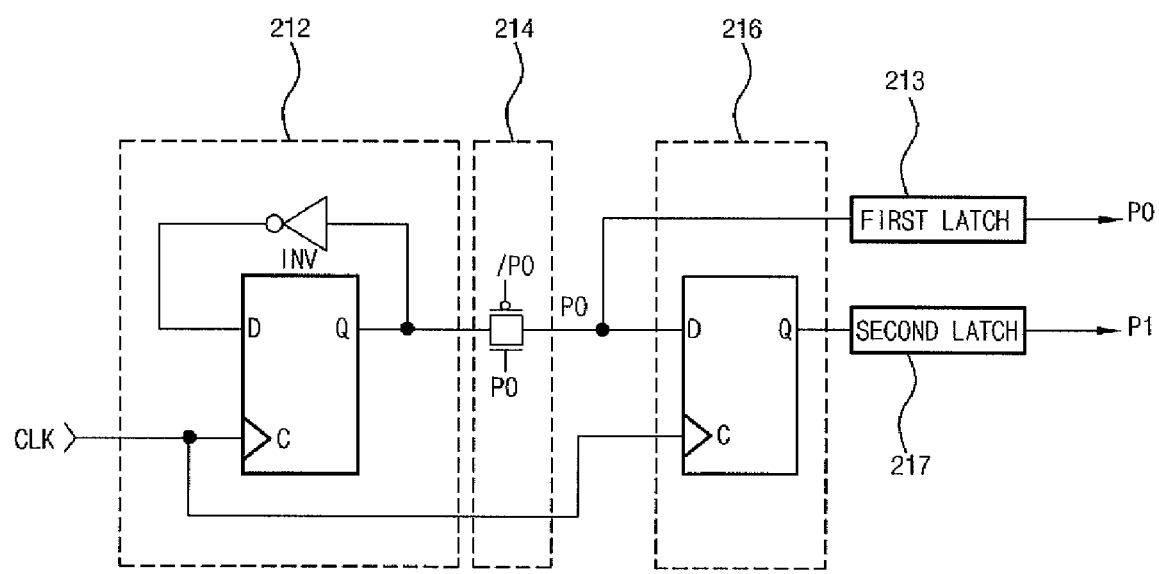
FIG. 8 is a circuit diagram exemplifying of the pulse generator in FIG. 7.

FIG. 8 is a circuit diagram of the edge signal generator 210 in FIG. 7. Referring to FIG. 8, the edge signal generator 210 includes a first edge signal generating unit 212, a transfer gate 214, a first latch 213, a second edge signal generating unit 216, and a second latch 217.

The first edge signal generating unit 212 generates the first edge signal PO shifted to a low state in synchronization with the first rising edge of the external clock. In more detail, the first edge signal generating unit 212 includes a D flip-flop having a clock terminal C receiving the external clock, a data terminal D receiving for a feedback an output signal inverted through an inverter INV, and an output terminal Q outputting the first edge signal PO. It is preferred that the output terminal of the first edge signal generating unit 212 is initialized in a high state.

The transfer gate 214 selectively outputs the first edge signal PO to the second edge signal generating unit 216 in response to the first edge signal PO and signal /PO obtained by inverting the phase of the first edge signal PO.

The first latch 213 latches and outputs the first edge signal PO transferred from the transfer gate 214, which may include two inverters in which an input terminal and an output terminal are interconnected.

The second edge signal generating unit 216 receives the first edge signal PO as a data signal, and generates the second edge signal P1 shifted to a low state in synchronization with the second rising edge of the external clock CLK. In more detail, the second edge signal generating unit 216 includes a D flip-flop having a clock terminal C receiving the external clock CLK, a data terminal D receiving the first edge signal PO, and an output terminal Q outputting the second edge signal P1.

The second latch 217 latches and outputs the second edge signal P1, which may include two inverters in which an input terminal and an output terminal are interconnected.

Figure 9:
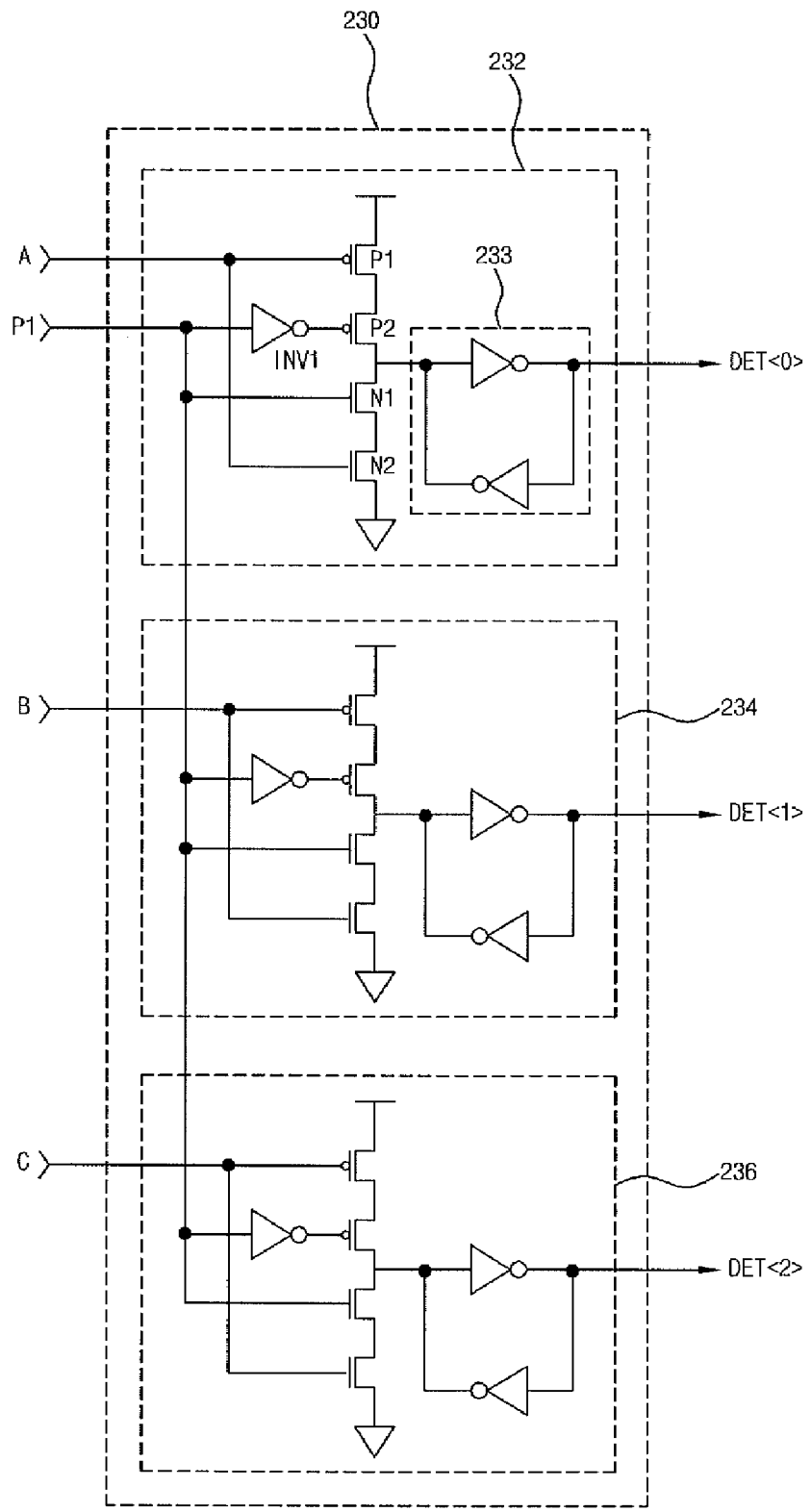
FIG. 9 is a circuit diagram exemplifying of the edge delay signal determiner in FIG. 7.

FIG. 9 is a circuit diagram exemplifying of the edge delay signal determiner in FIG. 7. Referring to FIG. 9, the edge delay signal determiner 230 includes a first delay signal determination unit 232, a second delay signal determination unit 234, and a third delay signal determination unit 236.

The first delay signal determination unit 232 detects the level state of an edge delay signal A in which the second edge signal P1 is in a high level state, and outputs a detection signal DET <0>.

In more detail, the first delay signal determination unit 232 includes a first PMOS transistor P1, a second PMOS transistor P2, a first NMOS transistor N1 and a second NMOS transistor N2, which are connected in series between supply voltage and ground voltage. The edge delay signal A is inputted to the gates of the first PMOS transistor P1 and the second NMOS transistor N2. The second edge signal P1 inverted by an inverter INV is inputted to the gate of the second PMOS transistor P2, and the second edge signal P1 is inputted to the gate of the first NMOS transistor N1. It is preferred that the first delay signal determination unit 232 further includes a latch 233 for latching and outputting the detection signal DET <0>.

Hereinafter, the operation of the first delay signal determination unit 232 will be described. First, if the edge delay signal A is in a low level state in which the second edge signal P1 is in a high level state, all of the first PMOS transistor P1, the second PMOS transistor P2, and the first NMOS transistor N1 are turned on, and the second NMOS transistor N2 is turned off. Accordingly, the second PMOS transistor P2 outputs a signal at a high level, and the latch 233 inverts the phase of the signal at the high level, and outputs the detection signal DET <0> at a low level. That is, if the edge delay signal A is in a low level state in which the second edge signal P1 is in a high level state, the latch 233 outputs the detection signal DET <0> at the low level.

Next, if the edge delay signal A is in a high level state in which the second edge signal P1 is in a high level state, the first PMOS transistor P1 is turned off, but the first NMOS transistor N1 and the second NMOS transistor N2 are turned on. Accordingly, the first NMOS transistor N1 outputs a signal at a low level, and the latch 233 inverts the phase of the signal at the low level to output the detection signal DET <0> at a high level. That is, if the edge delay signal A is in a high level state in which the second edge signal P1 is in a high level state, the latch 233 outputs the detection signal DET <0> at the high level.

The second delay signal determination unit 234 and the third delay signal determination unit 236 can output detection signals DET <1> and DET <2> through the same construction and operation as those of the first delay signal determination unit 232. In the present embodiment, the edge delay signal determiner 230 includes the three delay signal determination units 232, 234 and 236. However, the present invention is not limited to this example, and the number of delay signal determination units can increase depending on the number of edge delay signals.

Figure 10:
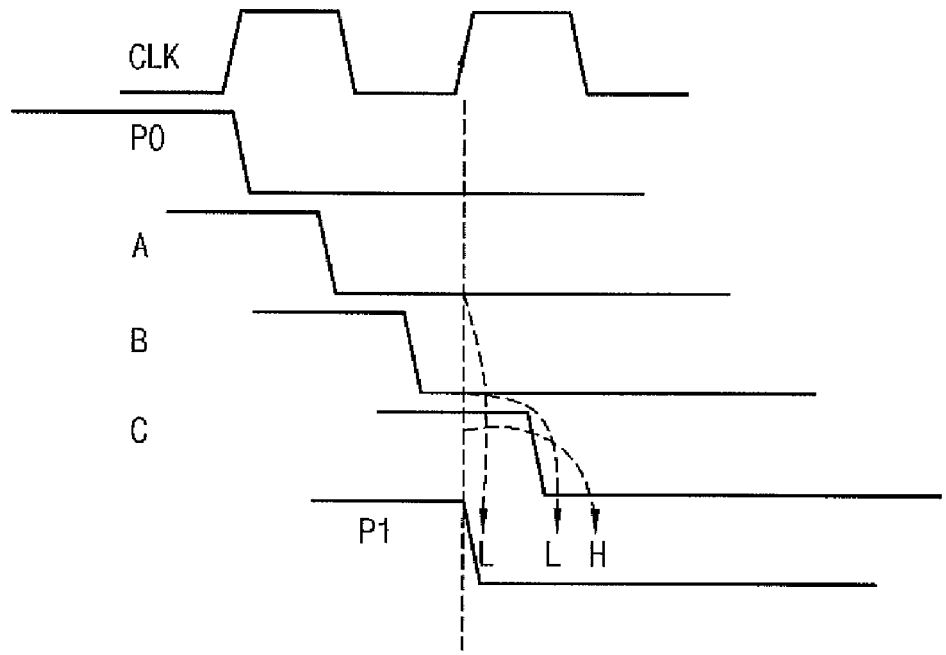
FIG. 10 is a timing diagram illustrating the phase detection operation of the phase detector in FIG. 7.
Figure 10:
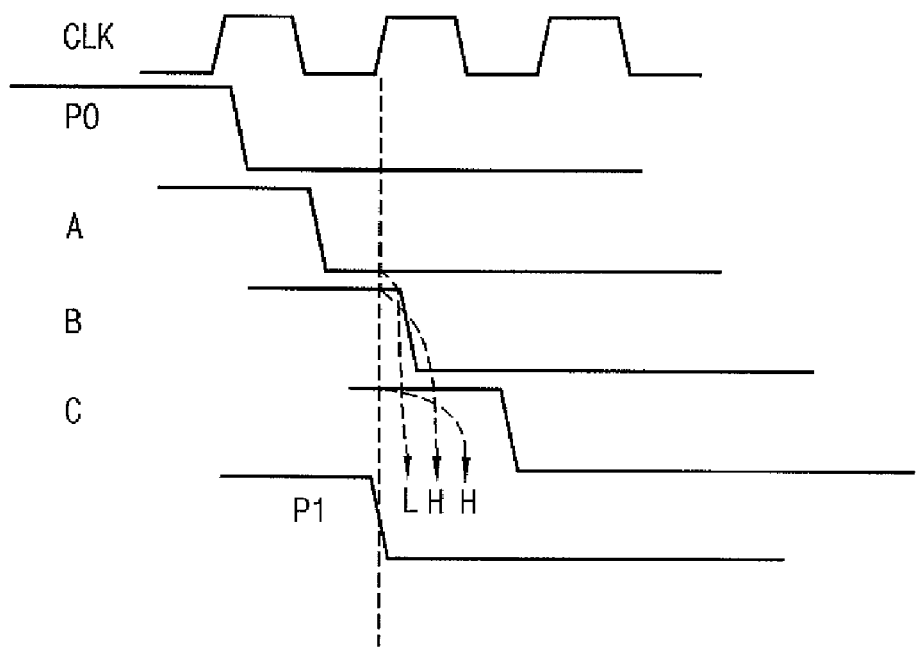

FIG. 10 is a timing diagram illustrating the phase detection operation of the phase detector in FIG. 7. First, a process by which the phase detector 200 determines the external clock as a low frequency clock will be described with reference to FIG. 10. The edge signal generator 210 generates the first edge signal PO shifted to a low state in synchronization with the first rising edge of the external clock. The delay means 220 generates edge delay signals A to C, in which a delay sequentially increases through the first to third delay units 222, 224 and 226. The edge delay signal determiner 230 determines the level states of the signals A to C when the second edge signal P1 is in a high level state, and outputs the detection signals DET <0:2> corresponding to a low state, a low state and a high state, respectively.

That is, if the level states of the edge delay signals A to C obtained by delaying the edge of the external clock are a low state, a low state and a high state, respectively, during one cycle of the external clock, the external clock can be determined as a low frequency clock having a wide pulse width.

Next, a process by which the phase detector 200 determines the external clock as a high frequency clock will be described. Since the operations of the edge signal generator 210 and the delay means 220 are the same as those in the process by which the phase detector 200 determines the external clock as a low frequency clock, details will be omitted. The edge delay signal determiner 230 determines the level states of the edge delay signals A to C when the second edge signal P1 is in a high level state, and outputs the detection signals DET <0:2> corresponding to a low state, a high state and a high state, respectively.

That is, if the level states of the edge delay signals A to C obtained by delaying the edge of the external clock are a low state, a high state and a high state, respectively, during one cycle of the external clock, the external clock can be determined as a high frequency clock having a narrow pulse width.

Figure 11:
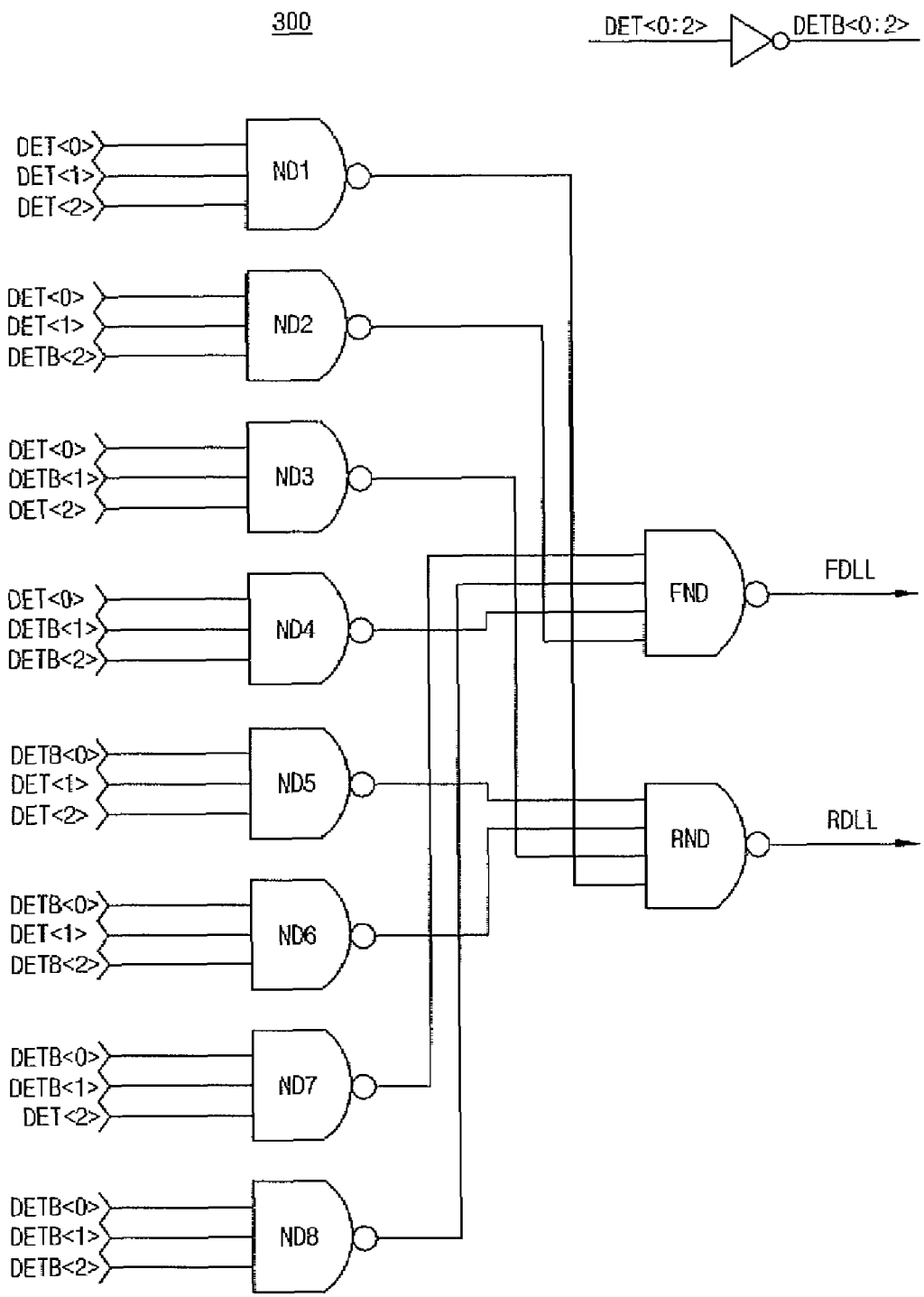
FIG. 11 is a circuit diagram exemplifying of the decoder in FIG. 6.

FIG. 11 is a circuit diagram exemplifying of the decoder in FIG. 6. Referring to FIG. 11, the decoder 300 includes 2$^n$ (n=2) NAND gates ND1 to ND8, a rising output gate RND, and a falling output gate FND. Each of the NAND gates ND1 to ND8 NANDs detection signals DET <0:n> at each level, respectively. The rising output gate RND receives a detection signal determined as a high frequency clock and NANDs the received detection signal. The falling output gate FND receives a detection signal determined as a low frequency clock and NANDs the received detection signal.

Herein, the detection signals DET <0:2> at each level denote DET<0>DET<1>DET<2>, DET<0>DET<1>DETB<2>, DET<0>DETB<1>DET<2>, DET<0>DETB<1>DETB<2>, DETB<0>DET<1>DET<2>, DETB<0>DET<1>DETB<2>, DETB<0>DETB<1>DET<2>, and DETB<0>DETB<1>DETB<2>. Further, Table 1 below shows the detection signal DET <0:2> determined as a low frequency clock, and the detection signal DET <0:2> determined as a high frequency clock.

TABLE 1

| DET<0> | DET<1> | DET<2> | Determination |
|---|---|---|---|
| LOW | LOW | LOW | Low frequency |
| LOW | LOW | HIGH | Low frequency |
| LOW | HIGH | HIGH | HIGH frequency |
| HIGH | HIGH | HIGH | HIGH frequency |

Hereinafter, the operation of the decoder 300 will be described. If one of the detection signals determined as a low frequency clock is enabled, the falling output gate FND enables and outputs a falling selection signal FDLL. If one of the detection signals determined as a high frequency clock is enabled, the rising output gate RND enables and outputs a rising selection signal RDLL.

Figure 12:
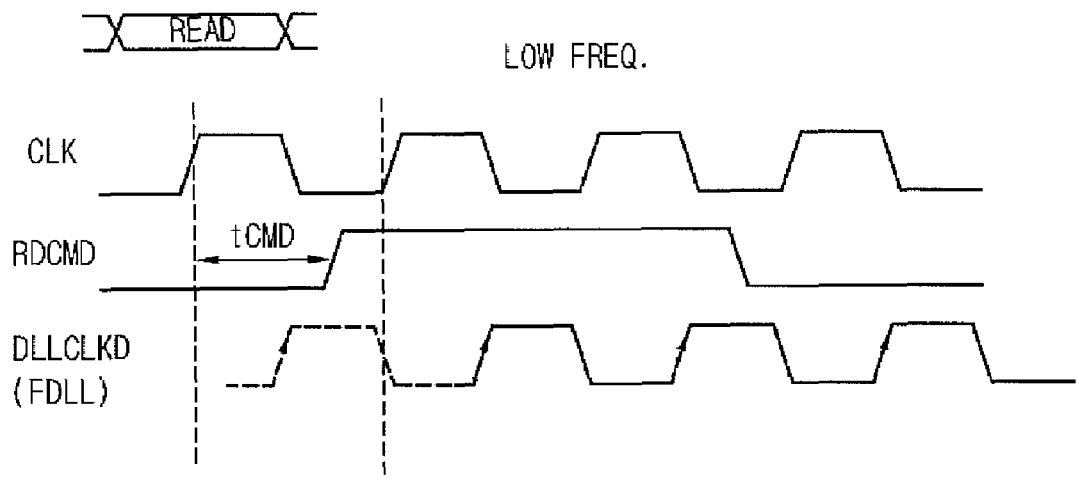
FIG. 12 is a timing diagram illustrating a domain crossing operation when a low frequency clock is inputted and a DLL is turned on in the data output control circuit in FIG. 6.

FIG. 12 is a timing diagram illustrating a domain crossing operation when a low frequency clock is inputted and the DLL is in the DLL off state in the data output control circuit in FIG. 6. As described above, the delay unit 400 inverts the phase of the DLLCLK to which the positive delay has been applied in response to the enabled falling selection signal FDLL, and outputs the DLLCLK having the inverted phase to the output enable signal generator 600.

In the case of a low frequency external clock, its pulse width is wide. Accordingly, the output enable signal generator 600 can perform the domain crossing operation for latching the RDCMD by using the enable time point of the RDCMD and the DLLCLKD with a certain margin.

Figure 13:
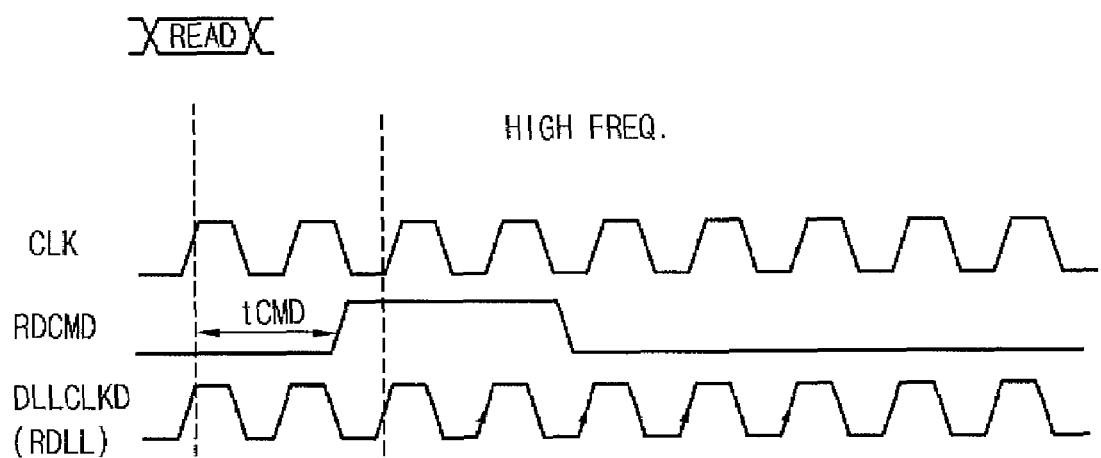
FIG. 13 is a timing diagram illustrating a domain crossing operation when a high frequency clock is inputted and a DLL is turned off in the data output control circuit in FIG. 6.

FIG. 13 is a timing diagram illustrating a domain crossing operation when a high frequency clock is inputted and the DLL is in the DLL off state in the data output control circuit in FIG. 6. As described above, the delay unit 400 delays the DLLCLK to which the positive delay has been applied in response to the enabled rising selection signal RDLL, and outputs the delayed clock DLLCLKD to the output enable signal generator 600.

According to the prior art, when an external high frequency clock is inputted, its pulse width is narrow. Therefore, in a domain crossing operation in which the output enable signal generator latches a RDCMD, there may occur a cross point at which the enable time point of the RDCMD coincides with the rising edge of the DLLCLKD. However, according to the present invention, the DLLCLK having an inverted phase is outputted to the output enable signal generator 600 according to frequency states to which the positive delay has been applied, so that it is possible to ensure a margin allowing the domain crossing operation to be stably performed.

That is, according to one embodiment of the present invention, in a case in which the DLL is turned off, the domain crossing operation can be stably performed even when an external low frequency clock is inputted or an external high frequency clock is inputted. Consequently, the operation frequency range of a semiconductor memory device can be widened.

As described above, since the data output control circuit of the present invention can detect a clock frequency and select a DLL clock used for domain crossing in the DLL-off operation, it can ensure a proper domain crossing margin in a low frequency and stably output data.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A data output control circuit comprising:
   a delay lock loop configured to output a first clock by delaying an external clock in response to a control signal;
   a phase detector configured to output a detection signal by detecting a frequency of the external clock in response to the control signal;
   a decoder configured to output a selection signal by decoding the detection signal; and
   a delay unit configured to output a second clock by delaying the first clock or inverting and delaying a phase of the first clock in response to the selection signal,
   wherein the phase detector includes
      an edge signal generator configured to generate a first edge signal synchronized with the first rising edge of the external clock, and a second edge signal synchronized with the second rising edge of the external clock; a delay component configured to generate at least one edge delay signal by delaying the first edge signal;
      an edge delay signal determiner for generating the detection signal according to level states of the edge delay signal in response to the second edge signal; and
      a clock transfer unit configured to selectively transfer the external clock to the edge signal generator in response to the control signal.

2. The data output control circuit of claim 1, wherein the delay lock loop is configured to positively delay the external clock if the control signal is enabled, wherein outputting the first clock.

3. The data output control circuit of claim 2, wherein the delay lock loop is configured to negatively delay the external clock if the control signal is disabled, wherein outputting the first clock.

4. The data output control circuit of claim 2 or 3, wherein the control signal is determined by at least one of a mode register set command and an address bit.

5. The data output control circuit of claim 1, wherein the phase detector is configured to output determination results for the level states of an edge delay signal as the detection signal, the edge delay signal being obtained by delaying an edge of the external clock, the level states being determined during a predetermined cycle of the external clock.

6. The data output control circuit of claim 5, wherein the phase detector operates when the control signal is enabled.

7. The data output control circuit of claim 1, wherein the edge signal generator comprises:
   a first edge signal generating unit configured to generate the first edge signal shifted to a predetermined state in synchronization with the first rising edge of the external clock;
   a transfer gate configured to selectively transfer the first edge signal in response to an inverted edge signal having a phase inverse to that of the first edge signal;
   a first latch configured to latch and to output the first edge signal transferred from the transfer gate;
   a second edge signal generating unit configured to receive the first edge signal from the transfer gate, and configured to generate the second edge signal shifted to a predetermined state in synchronization with the second rising edge of the external clock; and
   a second latch configured to latch and configured to output the second edge signal.

8. The data output control circuit of claim 1, wherein the delay component includes a plurality of delay units operatively connected in series.

9. The data output control circuit of claim 8, wherein the delay component is configured to generate a plurality of edge delay signals having an amount of delay sequentially increasing through the delay units.

10. The data output control circuit of claim 9, wherein the edge delay signal determiner is configured to output the detection signal according to the level states of the edge delay signal based on the second edge signal.

11. The data output control circuit of claim 10, wherein the edge delay signal determiner is configured to generate a detection signal for determining whether the external clock has a high frequency when a plurality of edge delay signals at a low level state occur in the edge delay signals in a state and when the second edge signal is in a high level state.

12. The data output control circuit of claim 11, wherein the edge delay signal determiner is configured to generate a detection signal determining whether the external clock has a low frequency when a plurality of edge delay signals at a high level state occur in the edge delay signals in a state and when the second edge signal is in a high level state.

13. The data output control circuit of claim 10, wherein the edge delay signal determiner includes delay signal determination units configured to correspond to the edge delay signal, wherein each of the delay signal determination units includes a first PMOS transistor, a second PMOS transistor, a first NMOS transistor and a second NMOS transistor, which are operatively connected in series between supply voltage and ground voltage.

14. The data output control circuit of claim 13, wherein the edge delay signal is configured to be inputted to gates of the first PMOS transistor and the second NMOS transistor, the second edge signal is configured to be inverted by an inverter and then configured to be inputted to a gate of the second PMOS transistor, and the second edge signal is configured to be inputted to a gate of the first NMOS transistor.

15. The data output control circuit of claim 12 or 14, wherein the decoder comprises:
   a falling output gate configured to receive a signal obtained by decoding the detection signal determined as the low frequency clock, wherein the falling output gate is configured to output a falling selection signal; and
   a rising output gate configured to receive a signal obtained by decoding the detection signal determined as the high frequency clock, wherein the rising output gate is configured to enable and to output a rising selection signal.

16. The data output control circuit of claim 1, further comprising:
   an internal command generator configured to output an internal read command by delaying a read command; and
   an output enable signal generator configured to generate an output enable signal by latching the internal read command to a rising edge of the second clock.

17. The data output control circuit of claim 1, wherein the control signal is a signal configured to control on/off of the delay lock loop.

* * * * *